United States Patent
Ozalevli et al.

(10) Patent No.: US 11,101,807 B2
(45) Date of Patent: *Aug. 24, 2021

(54) PHASE-LOCKED LOOP (PLL) CIRCUIT

(71) Applicant: TEXAS INSTRUMENTS INCORPORATED, Dallas, TX (US)

(72) Inventors: Erhan Ozalevli, Richardson, TX (US); Mustapha El Markhi, Richardson, TX (US); Tuli Dake, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/216,162

(22) Filed: Dec. 11, 2018

(65) Prior Publication Data

US 2019/0109596 A1    Apr. 11, 2019

Related U.S. Application Data

(63) Continuation of application No. 15/346,248, filed on Nov. 8, 2016, now Pat. No. 10,200,048.

(51) Int. Cl.
    *H03L 7/18*      (2006.01)
    *H03L 7/099*     (2006.01)
    *H03L 7/085*     (2006.01)
    *H03L 7/113*     (2006.01)
    *H03K 3/0231*    (2006.01)

(52) U.S. Cl.
    CPC ............. *H03L 7/099* (2013.01); *H03L 7/085* (2013.01); *H03L 7/113* (2013.01); *H03K 3/0231* (2013.01)

(58) Field of Classification Search
    CPC ......... H03L 7/18; H03L 7/099; H03L 7/1976; H03L 7/093; H03L 7/085; H03L 7/113
    See application file for complete search history.

(56) References Cited

U.S. PATENT DOCUMENTS

| | | | | |
|---|---|---|---|---|
| 6,111,533 A | * | 8/2000 | Yuan | H03M 1/0621 341/155 |
| 6,522,183 B2 | * | 2/2003 | Sumi | H03L 7/087 327/150 |
| 2006/0119443 A1 | * | 6/2006 | Azam | H03L 7/093 331/16 |
| 2007/0200637 A1 | * | 8/2007 | Kodato | H03L 7/093 331/16 |
| 2010/0208857 A1 | * | 8/2010 | Chen | H03L 7/087 375/376 |

* cited by examiner

*Primary Examiner* — Sibin Chen (74) *Attorney, Agent, or Firm* — Ray A. King; Charles A. Brill; Frank D. Cimino (57) ABSTRACT

One example includes a phase-locked loop (PLL) circuit. The circuit includes a frequency divider and phase detector configured to generate a plurality of non-overlapping switching signals based on an input signal and a PLL output signal. The circuit also includes a linear frequency-to-current (F2I) converter configured to generate a control current having an amplitude that is based on the plurality of non-overlapping switching signals. The circuit further includes a linear current-controlled oscillator configured to generate the PLL output signal to have a frequency and phase to be approximately equal to the input signal based on the amplitude of the control current.

14 Claims, 5 Drawing Sheets

PHASE-LOCKED LOOP (PLL) CIRCUIT

CROSS REFERENCE TO RELATED APPLICATION(S)

This continuation application claims priority to U.S. patent application Ser. No. 15/346,248, filed Nov. 8, 2016, which is incorporated herein by reference in its entirety.

TECHNICAL FIELD

This disclosure relates generally to electronic systems, and more specifically to a phase-locked loop (PLL) circuit.

BACKGROUND

Phase-locked loops (PLLs) circuits are used in a variety of electronic systems. A PLL can generate an oscillating output signal having a phase that is related to the phase of the oscillating input signal. As an example, a PLL may include a variable frequency oscillator and a phase detector (PD). The variable frequency oscillator generates a periodic signal, and the PD compares the phase of that signal with the phase of the input periodic signal, adjusting the oscillator output frequency and phase to keep the phases matched. When used for synchronizing signals, a PLL can track input frequency and keeps the input and output frequencies and phases the same. Moreover, when used for frequency synthesis, PLL can also generate a frequency that is a multiple of the input frequency. PLLs can be implemented by using analog or digital circuits that consist of four basic elements, namely, phase-detector, low-pass filter, variable frequency oscillator, and feedback path. Digital PLLs employ a time-to-digital converter, digital loop filter, digitally controlled oscillator circuits instead of a charge pump, analog filter and voltage/current controlled oscillator circuits.

For integrated circuits that do not have a digital core or processor, such as standalone voltage/current mode controlled switching regulator ICs, analog PLL is generally utilized to synchronize the switching frequency to external clock. These applications have wide switching frequency that can range from 100 kHz to 3 MHz or more. PLL is also employed in these systems to lock onto phase and frequency of the external input clock to achieve multi-phase operation, to eliminate beat frequency noise, and to ensure that power supply noise is kept of sensitive frequency bands. In such systems, solution size and die area (cost), settling time, tuning range are very important design parameters. The design of analog PLLs at low input frequencies results in increased size and settling time. For example, charge-pump based analog PLL's smaller settling time requires a wider loop bandwidth. However, when used for input frequencies 100 kHz or lower, PLL has to meet its stability requirement by limiting its bandwidth and increasing its filter component sizes. As a result, PLL die area grows considerably and PLL settling time gets longer due to larger loop filter components. As low-cost and smaller circuit solutions become more in demand, there is a need for alternative solutions to have a smaller die area and settling-time PLL.

SUMMARY

One example includes a phase-locked loop (PLL) circuit. The circuit includes a frequency divider configured to generate a first set of non-overlapping switching signals based on an input signal. The circuit also includes a phase detector configured to generate a second set of non-overlapping switching signals based on an input signal and a PLL output signal. The circuit also includes at least one linear frequency-to-analog converter configured to generate a control signal having an amplitude that is based on the first and second sets of non-overlapping switching signals. The circuit further includes a linear oscillator configured to generate the PLL output signal to have a frequency and phase that approximate the input signal based on the amplitude of the control signal.

Another example includes a PLL circuit. The circuit includes a frequency divider configured to generate a first set of non-overlapping switching signals based on an input signal. The circuit also includes a phase detector configured to generate a second set of non-overlapping switching signals based on an input signal and a PLL output signal. The circuit also includes a first linear frequency-to-analog converter configured to generate a first control signal portion via the first set of non-overlapping switching signals. The first control signal has an amplitude that is based on a frequency of the input signal. The circuit also includes a second linear frequency-to-analog converter configured to generate a second control signal portion via the second set of non-overlapping switching signals. The second control signal has an amplitude that is based on a phase difference between the input signal and the PLL output signal. The circuit further includes a linear oscillator configured to generate the PLL output signal based on a control signal having an amplitude that is a difference between the first and second control signal portions.

Another example includes a PLL circuit. The circuit includes a frequency divider configured to generate a first set of non-overlapping switching signals based on an input signal. The circuit also includes a phase detector configured to generate a second set of non-overlapping switching signals based on an input signal and a PLL output signal. The circuit also includes a first linear frequency-to-current (F2I) converter configured to generate a first F2I control current portion via the first set of non-overlapping switching signals. The first F2I control current portion has an amplitude that is based on the frequency of the input signal. The circuit also includes a second linear F2I converter configured to generate a second F2I control current portion via the second set of non-overlapping switching signals. The second F2I control current portion has an amplitude that is based on a phase-difference between the input signal and the PLL output signal, wherein the amplitude of the control current is equal to a difference of the first F2I control current portion and the second F2I control current portion. The circuit further includes a linear current-controlled oscillator configured to generate the PLL output signal to have a frequency and phase that approximate the input signal based on the amplitude of the control current.

DETAILED DESCRIPTION

This disclosure relates generally to electronic systems, and more specifically to a phase-locked loop (PLL) circuit. The PLL circuit includes a frequency divider and a phase detector configured to generate a plurality of switching signals based on an input signal and a PLL output signal generated by a linear oscillator. As an example, the frequency divider can generate a first set of non-overlapping switching signals based on the input signal, such that the first set of non-overlapping switching signals has a frequency that is based on the input signal (e.g., approximately half of the input signal) and has a duty-cycle of approximately 50%. As another example, the phase detector can generate a second set of non-overlapping switching signals based on a phase difference between the input signal and the PLL output signal, such that the second set of non-overlapping switching signals has a frequency that is based on the input signal and has a duty-cycle that is based on the phase difference. For example, in steady state, the frequency of the second set of non-overlapping signals can be set by the frequency of the input signal. Also, if there is no nonlinearity in the conversion of control signals by the linear F2I converter and the linear oscillator, then the duty-cycle becomes approximately 50%. The nonlinearity in the conversions can be exhibited as a phase-error in the PLL output signal. In such a case, the duty-cycle of the second set of non-overlapping switching signals differs from 50%.

The PLL circuit also includes linear frequency-to-analog converters (e.g., linear frequency-to-current (F2I) converters) that are employed to generate a control signal (e.g., control current) that is based on linear functions of the switching input signal frequency and the phase-difference between the input signal and the PLL output signal. As an example, a first linear F2I converter can generate a first current portion based on the first set of non-overlapping switching signals. The linear F2I converters and the linear oscillator (e.g., linear current-controlled oscillator) are designed such that when only the first F2I control current portion is fed to the linear oscillator, the linear oscillator can generate an oscillator output signal that has two times the switching frequency of the input signal. As another example, the second linear frequency-to-current converter can generate a second F2I control current portion based on the frequency and duty-cycle of the second set of non-overlapping switching signals. The second linear F2I converter can generate the second F2I control current portion that is approximately half the amplitude of the first F2I control current portion during a steady state, such that the difference between the first and second F2I control current portions set the linear oscillator to produce the PLL output signal that has the same switching frequency as the input signal. In steady state, when there is no nonlinearity in conversion of the two sets of non-overlapping switching signals into the control current by the first and second linear F2I converters and conversion of the control current into the PLL output signal across a frequency range of interest, the PLL output signal has the same switching frequency and phase as the input signal. As a result, the duty-cycle of the second set of non-overlapping switching signals becomes approximately 50%. However, when there is nonlinearity in the respective conversions, then the PLL output signal still has the same switching frequency as the input signal, but exhibits a phase error between the input signal and the PLL output signal to compensate for the nonlinearity to force alignment of the frequencies of the input signal and the PLL output signal. This nonlinearity and phase-error causes the duty-cycle of the second set of non-overlapping switching signals to differ from 50% by the same amount as phase-error.

Therefore, the linear F2I converters may provide the control current as a difference of the first and second F2I control current portions. In this way, the amplitude of the control current is provided based on feedback associated with the PLL output signal. The PLL circuit further includes a linear current-controlled oscillator that generates the PLL output signal based on the amplitude of the control current, such that the linear F2I converters set the amplitude of the control current to set the switching frequency and phase of the PLL output signal to the switching frequency and phase of the input signal.

Figure 1:
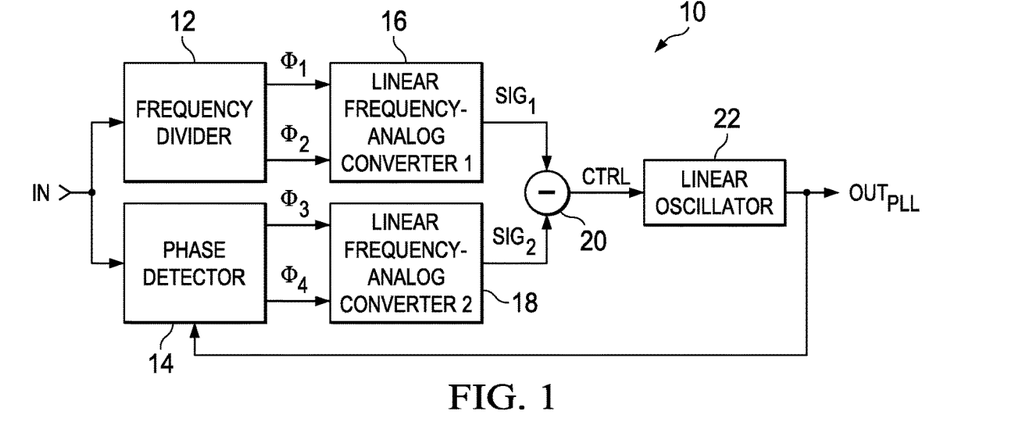
FIG. 1 illustrates an example of a PLL circuit.

FIG. 1 illustrates an example of a PLL circuit 10. The PLL circuit 10 can be employed in a variety of circuit applications, such as in a DC-DC power converter or a communication system. As an example, the PLL circuit 10 can be implemented in or as part of an integrated circuit (IC) chip. The PLL circuit 10 is configured to generate a PLL output signal $OUT_{PLL}$ based on an oscillating input signal IN (e.g., a clock signal), such that the PLL output signal has a frequency and phase that are aligned with the input signal IN.

The PLL circuit 10 includes a frequency divider 12 and a phase detector 14. The frequency divider 12 is configured to generate a first set of non-overlapping switching signals $\Phi_1$ and $\Phi_2$ based on the input signal IN. As an example, the first set of the non-overlapping switching signals $\Phi_1$ and $\Phi_2$ can be generated based on the input signal IN, such that the first set of non-overlapping switching signals $\Phi_1$ and $\Phi_2$ can have a frequency that is based on the frequency of the input signal IN (e.g., approximately half of the frequency of the input signal IN) and can have a duty-cycle of approximately 50%. The phase detector 14 is configured to generate a second set of non-overlapping switching signals $\Phi_3$ and $\Phi_4$ based on the input signal IN and the PLL output signal $OUT_{PLL}$. As an example, the second set of the non-overlapping switching signals $\Phi_3$ and $\Phi_4$ can be generated based on a frequency of the input signal IN and the phase difference between the input signal IN and the PLL output signal $OUT_{PLL}$. Thus, in steady state, the second set of the non-overlapping switching signals $\Phi_3$ and $\Phi_4$ can have a frequency that is based on the frequency of input signal IN and can have a duty-cycle that varies based on the phase difference between the input signal IN and the PLL output signal $OUT_{PLL}$. As described herein, the variation of the phase difference between the input signal IN and the PLL output signal $OUT_{PLL}$ corresponds to a deviation from a 50% duty-cycle of the complementary activation of the second set of the non-overlapping switching signals $\Phi_3$ and $\Phi_4$ relative to each other.

The non-overlapping switching signals $\Phi_1$ and $\Phi_2$ are provided to a first linear frequency-to-analog converter 16, and the non-overlapping switching signals $\Phi_3$ and $\Phi_4$ are provided to a second linear frequency-to-analog converter 18. The first linear frequency-to-analog converter 16 is configured to generate a first analog control signal portion $SIG_1$ that has an amplitude that is based on the digital non-overlapping switching signals $\Phi_1$ and $\Phi_2$, and is thus based on the frequency of the input signal IN. Similarly, the second linear frequency-to-analog converter 18 is configured to generate a second analog control signal portion $SIG_2$ that has an amplitude that is based on the digital non-overlapping switching signals $\Phi_3$ and $\Phi_4$, and is thus based on a phase-feedback of the PLL output signal $OUT_{PLL}$ relative to the input signal IN. The first and second analog control signal portions $SIG_1$ and $SIG_2$ are provided to a subtractor 20 to generate a control signal CTRL that is a difference between the first and second analog control signal portions $SIG_1$ and $SIG_2$.

As an example, the first linear frequency-to-analog converter 16 can include a switched-capacitor current source to control an amplitude of a current. Similarly, the second linear frequency-to-analog converter 18 can also include a switched-capacitor current source to control an amplitude of a current generated via a current generator. The current generator can mirror the second control signal portion $SIG_2$ from the associated output node, such that the second control signal portion $SIG_2$ is subtracted from the first control signal portion $SIG_1$. Therefore, the control signal CTRL can correspond to a difference of the first and second signal portions $SIG_1$ and $SIG_2$ with respect to the output node associated with the linear frequency-to-analog converters 16 and 18. In this way, the second control signal portion $SIG_2$ can vary based on the frequency of the input signal IN and the phase difference between the input signal IN and the PLL output signal $OUT_{PLL}$, as provided via the second set of the non-overlapping switching signals $\Phi_3$ and $\Phi_4$, which provides feedback to vary the amplitude of the control signal CTRL.

The control signal CTRL is provided from the subtractor 20 to a linear oscillator 22. The linear oscillator 22 is configured to generate the digital PLL output signal $OUT_{PLL}$ based on the amplitude of the analog control signal CTRL, such that the frequency of the PLL output signal $OUT_{PLL}$ is based on an amplitude of the control signal CTRL in a linear manner. As an example, the linear oscillator 22 can be configured as a linear current-controlled oscillator, such that the linear oscillator 22 can generate the PLL output signal $OUT_{PLL}$ based on an analog control current $I_{CTRL}$. Alternatively, the linear oscillator 22 can be configured as a voltage-controlled linear oscillator, such that the linear oscillator 22 can generate the PLL output signal $OUT_{PLL}$ based on an analog control voltage $V_{CTRL}$.

For example, the linear oscillator 22 can include digital logic and analog circuitry to generate the PLL output signal $OUT_{PLL}$ based on an oscillating signal that is generated via a comparator and current integrated by capacitors. The linear oscillator 22 can include control circuitry to set the oscillation frequency of the PLL output signal $OUT_{PLL}$ based on the control signal CTRL (e.g., a control current), a reference voltage, and capacitor size(s). Thus, the capacitor voltage can be compared with a predetermined oscillator reference voltage via a comparator. Thus, the comparator can generate the oscillating signal based on the comparison. The oscillating signal can have a frequency that is based on the amplitude of the control signal CTRL, such that the PLL output signal $OUT_{PLL}$ likewise has a frequency that is based on the amplitude of the control signal CTRL. Thus, the linear oscillator 22 is configured to convert the frequency and phase information associated with the input signal IN and the PLL output signal $OUT_{PLL}$ from the analog domain, as provided via the analog control signal CTRL, back to the digital domain in generating the PLL output signal $OUT_{PLL}$. Accordingly, the PLL circuit 10 can generate the PLL output signal $OUT_{PLL}$ to be phase-aligned with the input signal IN in a feedback manner.

Figure 2:
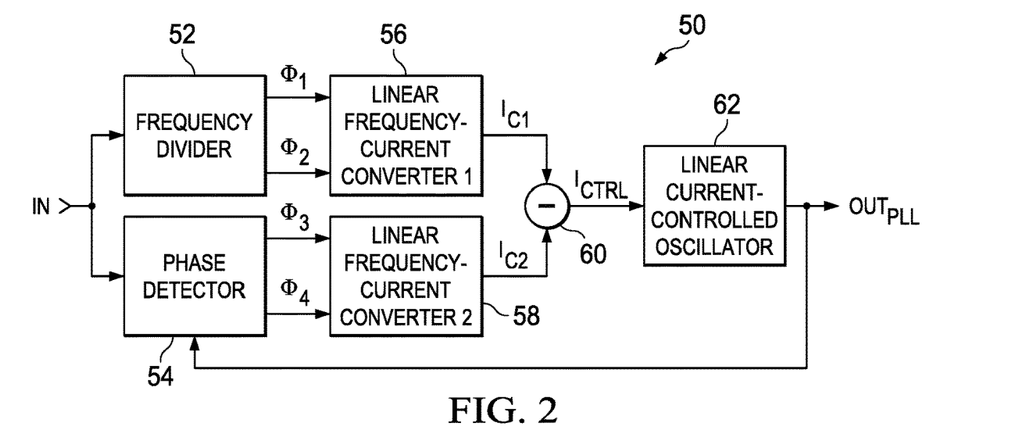
FIG. 2 illustrates another example of a PLL circuit.

FIG. 2 illustrates an example of a PLL circuit 50. The PLL circuit 50 can be employed in a variety of circuit applications, such as in a DC-DC power converter or a communication system. As an example, the PLL circuit 50 can be implemented in or as part of an integrated circuit (IC) chip. The PLL circuit 50 is configured to generate a PLL output signal $OUT_{PLL}$ based on an oscillating input signal IN (e.g., a clock signal), such that the PLL output signal has a frequency and phase that are aligned with the input signal IN.

The PLL circuit 50 includes a frequency divider 52 and a phase detector 54. The frequency divider 52 is configured to generate a first set of non-overlapping switching signals $\Phi_1$ and $\Phi_2$ based on the input signal IN. As an example, the first set of the non-overlapping switching signals $\Phi_1$ and $\Phi_2$ can be generated based on the input signal IN, such that the first set of non-overlapping switching signals $\Phi_1$ and $\Phi_2$ can have a frequency that is based on the input signal IN (e.g., approximately half of the frequency of the input signal IN) and can have a duty-cycle of approximately 50%. The phase detector 54 is configured to generate a second set of non-overlapping switching signals $\Phi_3$ and $\Phi_4$ based on the input signal IN and the PLL output signal $OUT_{PLL}$. As an example, the second set of the non-overlapping switching signals $\Phi_3$ and $\Phi_4$ can be generated based on the frequency of the input signal IN and the phase difference between the input signal IN and the PLL output signal $OUT_{PLL}$. Thus, in steady state, the second set of the non-overlapping switching signals $\Phi_3$ and $\Phi_4$ can have a frequency that is based on the frequency of the input signal IN and can have a duty-cycle that varies based on the phase difference between the input signal IN and the PLL output signal $OUT_{PLL}$. As described herein, the variation of the phase difference between the input signal IN and the PLL output signal $OUT_{PLL}$ corresponds to a deviation from a 50% duty-cycle of the complementary activation of the second set of the non-overlapping switching signals $\Phi_3$ and $\Phi_4$ relative to each other.

The non-overlapping switching signals $\Phi_1$ and $\Phi_2$ are provided to a first linear frequency-to-current converter 56, and the non-overlapping switching signals $\Phi_3$ and $\Phi_4$ are provided to a second linear frequency-to-current converter 58. The first linear frequency-to-current converter 56 is configured to generate a first F2I control current portion $I_{C1}$ that has an amplitude that is based on the digital non-overlapping switching signals $\Phi_1$ and $\Phi_2$, and is thus based on the frequency of the input signal IN. Similarly, the second linear frequency-to-current converter 58 is configured to generate a second F2I control current portion $I_{C2}$ that has an amplitude that is based on the digital non-overlapping switching signals $\Phi_3$ and $\Phi_4$, and is thus based on a phase-feedback of the PLL output signal $OUT_{PLL}$ relative to the input signal IN. The first and second F2I control current portions $I_{C1}$ and $I_{C2}$ are provided to a subtractor 60 to generate a control current $I_{CTRL}$ that is a difference between the first and second F2I control current portions $I_{C1}$ and $I_{C2}$.

As an example, the first linear frequency-to-current converter 56 can include a switched-capacitor resistor and a switched-capacitor integrator circuit to set an amplitude of a control voltage to control an amplitude of a output current generated via a current generator. Similarly, the second linear frequency-to-current converter 58 includes a switched-capacitor resistor and a switched-capacitor integrator circuit to set a control voltage to control a current generator. The second linear frequency-to-current converter 58 may also include a current generator configured to mirror the second control current portion $I_{C2}$ from the associated output node, such that the second control current portion $I_{C2}$ is subtracted from the first control current portion $I_{C1}$. Therefore, the control current $I_{CTRL}$ can correspond to a difference of the first and second current portions $I_{C1}$ and $I_{C2}$ with respect to the output node associated with the linear frequency-to-current converters 56 and 58. In this way, the second control current portion $I_{C2}$ can vary based on the frequency of the input signal IN and the phase difference between the input signal IN and the PLL output signal $OUT_{PLL}$, as provided via the second set of the switching signals $\Phi_3$ and $\Phi_4$, which provides feedback to vary the amplitude of the control current $I_{CTRL}$.

The control current $I_{CTRL}$ is provided from the subtractor 60 to a linear current-controlled oscillator 62. The linear current-controlled oscillator 62 is configured to generate the PLL output signal $OUT_{PLL}$ based on the amplitude of the control current $I_{CTRL}$, such that the frequency of the PLL output signal $OUT_{PLL}$ is based on an amplitude of the control current $I_{CTRL}$ in a linear manner. For example, the linear current-controlled oscillator 62 can include digital logic and analog circuitry that generates the PLL output signal $OUT_{PLL}$. The linear current-controlled oscillator 62 can also include control circuitry to set the oscillation frequency of the PLL output signal $OUT_{PLL}$ based on the control signal CTRL (e.g., a control current), a reference voltage, and capacitor size(s). The control current $I_{CTRL}$ is integrated on the capacitors until the capacitor voltage exceeds a reference voltage amplitude. When the voltage of one of the capacitors exceeds the reference voltage, the comparator output changes state and changes the states of oscillating output signals to cause the capacitor voltage to be discharged to zero and to start the current integration on the other capacitor. The integration time sets half of the oscillator frequency. Thus, the comparator can generate the oscillating output signals based on the comparison. The oscillating output signals can have a frequency that is based on the amplitude of the control current $I_{CTRL}$, the oscillator reference voltage, and capacitor size(s). While the reference voltage and capacitor size(s) are fixed, the amplitude of the control current $I_{CTRL}$ varies such that the PLL output signal $OUT_{PLL}$ likewise has a frequency that is based on the amplitude of the control current $I_{CTRL}$. Thus, the linear current-controlled oscillator 62 is configured to convert the frequency and phase information associated with the input signal IN and the PLL output signal $OUT_{PLL}$ from the analog domain, as provided via the analog control current $I_{CTRL}$, back to the digital domain in generating the PLL output signal $OUT_{PLL}$. Accordingly, the PLL circuit 50 can generate the PLL output signal $OUT_{PLL}$ to be phase-aligned with the input signal IN in a feedback manner.

While the example of FIG. 2 describes the use of linear F2I converters 56 and 58 and a linear current-controlled oscillator 62, it is to be understood that, as an alternative, the linear frequency-to-current converters 56 and 58 can instead be configured as linear frequency-to-voltage (F2V) converters, such that the analog current $I_{CTRL}$ can be provided instead as an analog control voltage $V_{CTRL}$. Additionally, the linear current-controlled oscillator 62 could instead be configured as a linear voltage-controlled oscillator to generate the PLL output signal $OUT_{PLL}$ from the analog control voltage $V_{CTRL}$. Accordingly, the PLL circuit 10 and the PLL circuit 50 can be configured in a variety of ways.

Figure 3:
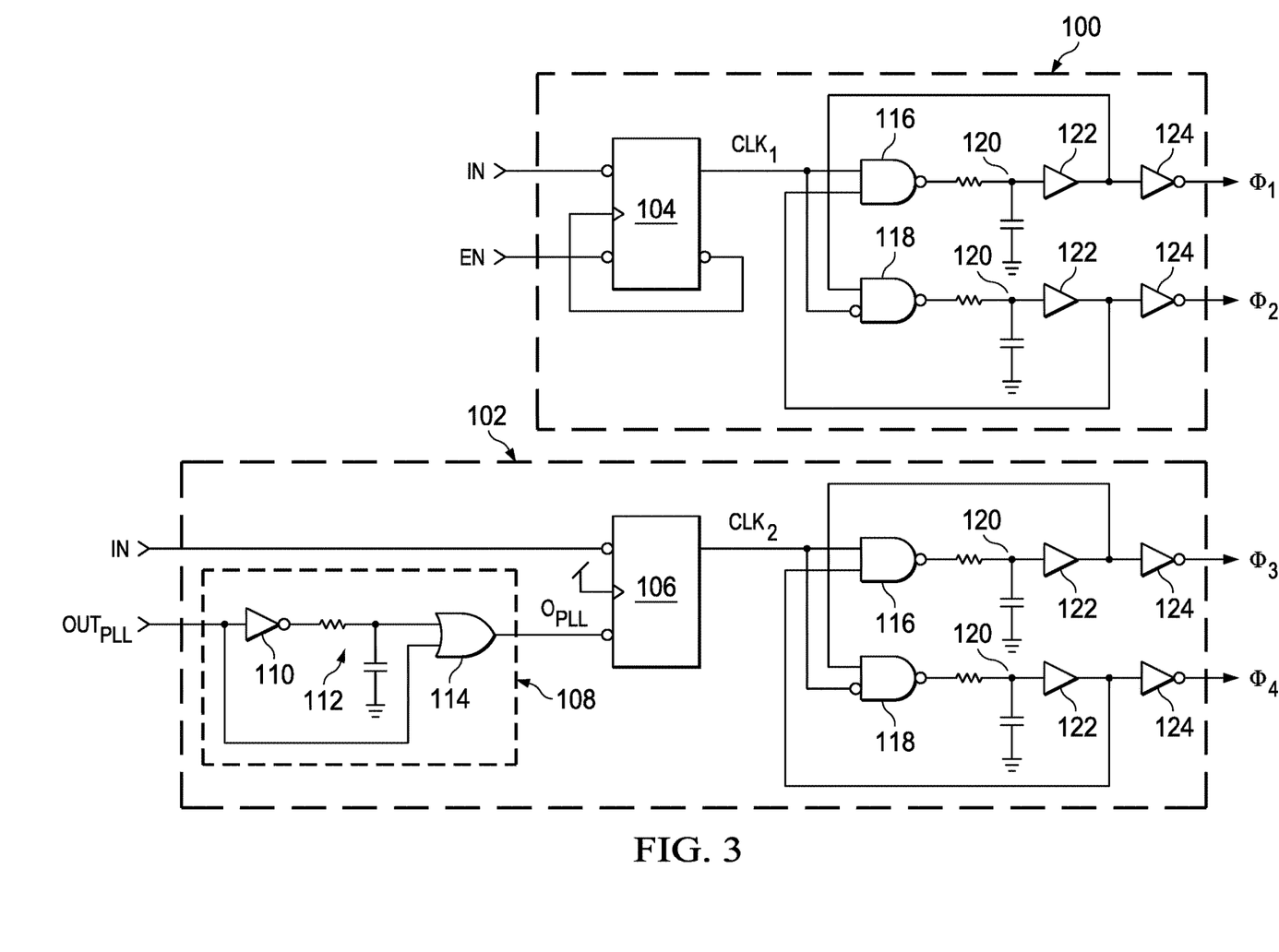
FIG. 3 illustrates an example of a frequency divider and phase detector.

FIG. 3 illustrates an example of a frequency divider 100 and a phase detector 102. The frequency divider 100 and the phase detector 102 can correspond to the frequency divider and phase detector 12 in the example of FIG. 1. Therefore, reference is to be made to the example of FIG. 1 in the following description of the example of FIG. 3.

The frequency divider 100 and the phase detector 102 are collectively configured to generate four switching signals, demonstrated in the example of FIG. 3 as $\Phi_1$, $\Phi_2$, $\Phi_3$, and $\Phi_4$, based on the input signal IN, an enable signal EN, and the PLL output signal $OUT_{PLL}$. The frequency divider 100 is configured to generate the non-overlapping switching signals $\Phi_1$ and $\Phi_2$, and the phase detector 102 is configured to generate the non-overlapping switching signals $\Phi_3$ and $\Phi_4$. The frequency divider 100 includes a latch 104, and the phase detector 102 includes a latch 106. As an example, each of the latches 104 and 106 can be configured as D-latches. The latch 104 receives the input signal IN and the enable signal EN (e.g., at respective "CLK" and "CLRZ" inputs), and an inverting output that is provided to an input (e.g., a "D" input).

The latch 106 that receives the input signal IN and a signal $O_{PLL}$ (e.g., at respective "CLK" and "CLRZ" inputs), and an input (e.g., a "D" input) that is provided a predetermined voltage. The signal $O_{PLL}$ is generated via an input circuit 108 that includes an inverter 110 that receives the PLL output signal $OUT_{PLL}$. The input circuit also includes an RC filter 112 that provides delay with respect to the inverted PLL output signal $OUT_{PLL}$ and an OR-gate 114 that is configured to receive the delayed inverted PLL output signal $OUT_{PLL}$ and an inverted version of the PLL output signal $OUT_{PLL}$. Therefore, the signal $O_{PLL}$ is de-asserted in response to a falling-edge of the PLL output signal $OUT_{PLL}$, and is re-asserted after the RC filter delay is expired. As a result, the signal $O_{PLL}$ is provided to the latch 106 as a reset signal.

The latch 104 thus generates a first clock signal $CLK_1$ having rising and falling edges in response to a rising-edge of the input signal IN. The first clock signal $CLK_1$ is provided to a set of logic that is configured to generate the non-overlapping switching signals $\Phi_1$ and $\Phi_2$. Conversely, the latch 106 generates a second clock signal $CLK_2$ having a rising-edge in response to a rising-edge of the input signal IN and a falling-edge in response to a falling-edge of the signal $O_{PLL}$. The second clock signal $CLK_2$ is provided to a set of logic that is configured to generate the non-overlapping switching signals $\Phi_3$ and $\Phi_4$.

In the example of FIG. 3, each set of logic associated with the frequency divider 100 and the phase detector 102 is similarly configured. For example, each set of logic includes a first NAND gate 116 and a second NAND gate 118 that each receives a respective one of the first and second clock signals $CLK_1$ and $CLK_2$, with the second NAND gate 118 receiving the respective one of the first and second clock signals $CLK_1$ and $CLK_2$ at an inverting input thereof. The NAND gates 116 and 118 provide respective output signals that are filtered via respective RC filters 120 to add delay to the logic signals therein, buffered via buffers 122, and inverted via inverters 124 to generate the respective switching signals $\Phi_1$, $\Phi_2$, $\Phi_3$, and $\Phi_4$. The buffered signals at the output of the buffers 122 provide respective feedback signals back to the inputs of the respective other NAND gates 118 and 116. Therefore, the NAND gate 116 associated with the frequency divider 100 generates the switching signal $\Phi_1$, and the NAND gate 118 associated with the frequency divider 100 generates the switching signal $\Phi_2$. Similarly, the NAND gate 116 associated with the phase detector 102 generates the switching signal $\Phi_3$, and the NAND gate 118 associated with the phase detector 102 generates the switching signal $\Phi_4$.

Because the first clock signal $CLK_1$ is generated via the input signal IN and an enable signal EN, such as held substantially constantly at a logic-high state, the non-overlapping switching signals $\Phi_1$ and $\Phi_2$ can have a frequency that is equal to half the frequency of the input signal IN, and can have duty-cycle of approximately 50%. However, because the second clock signal $CLK_2$ is generated via the input signal IN and via the PLL output signal $OUT_{PLL}$, the latch 106 can be configured to compare the phases of the input signal IN and the PLL output signal $OUT_{PLL}$. Therefore, in steady state, the non-overlapping switching signals $\Phi_3$ and $\Phi_4$ can have a frequency that is equal to the input signal IN, and can have duty-cycle that varies based on the phase-difference between the input signal IN and the PLL output signal $OUT_{PLL}$. Particularly, because the latch 106 generates a second clock signal $CLK_2$ to have a rising-edge in response to a rising-edge of the input signal IN and a falling-edge in response to a falling-edge of the signal $O_{PLL}$, the non-overlapping switching signals $\Phi_3$ and $\Phi_4$ can have a duty-cycle that deviates from 50% based on the phase-difference between the input signal IN and the PLL output signal $OUT_{PLL}$.

Figure 4:
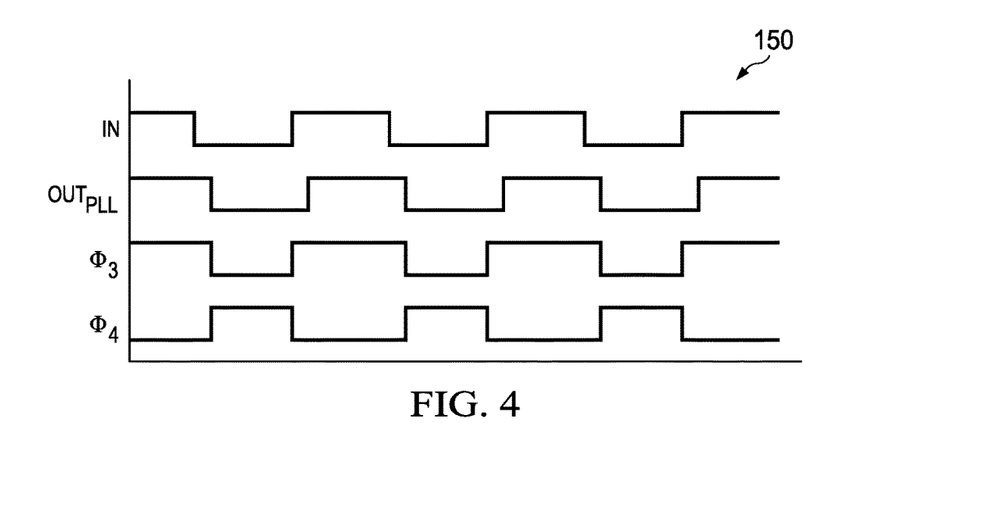
FIG. 4 illustrates an example of a timing diagram.

The relative timing of the non-overlapping switching signals $\Phi_3$ and $\Phi_4$ is demonstrated in the example of FIG. 4. FIG. 4 illustrates an example of a timing diagram 150. It is to be understood that the timing diagram 150 is demonstrated in a simplistic manner, such that the timing may not be to scale with respect to the signals described herein. The timing diagram 150 demonstrates the input signal IN, the PLL output signal $OUT_{PLL}$, and the non-overlapping switching signals $\Phi_3$ and $\Phi_4$. In the example of FIG. 4, the input signal IN and the PLL output signal $OUT_{PLL}$ are demonstrated as being phase-misaligned, such that the input signal IN has a rising-edge that occurs prior to the rising-edge of the PLL output signal $OUT_{PLL}$, and the input signal IN has a falling-edge that occurs prior to the falling-edge of the PLL output signal $OUT_{PLL}$. Therefore, based on the operation of the phase detector 102, the switching signal $\Phi_3$ has a rising-edge that approximately coincides with the input signal IN, but has a falling-edge that approximately coincides with the PLL output signal $OUT_{PLL}$. The switching signal $\Phi_4$ is demonstrated as having an inverse logic state relative to the switching signal $\Phi_3$. Therefore, the non-overlapping switching signals $\Phi_3$ and $\Phi_4$ have a duty-cycle that deviates from 50% based on the phase-difference between the input signal IN and the PLL output signal $OUT_{PLL}$. The phase detector 102 thus detects the phase difference between the input signal IN and the PLL output signal $OUT_{PLL}$ based on how the non-overlapping switching signals $\Phi_3$ and $\Phi_4$ are generated.

Figure 5:
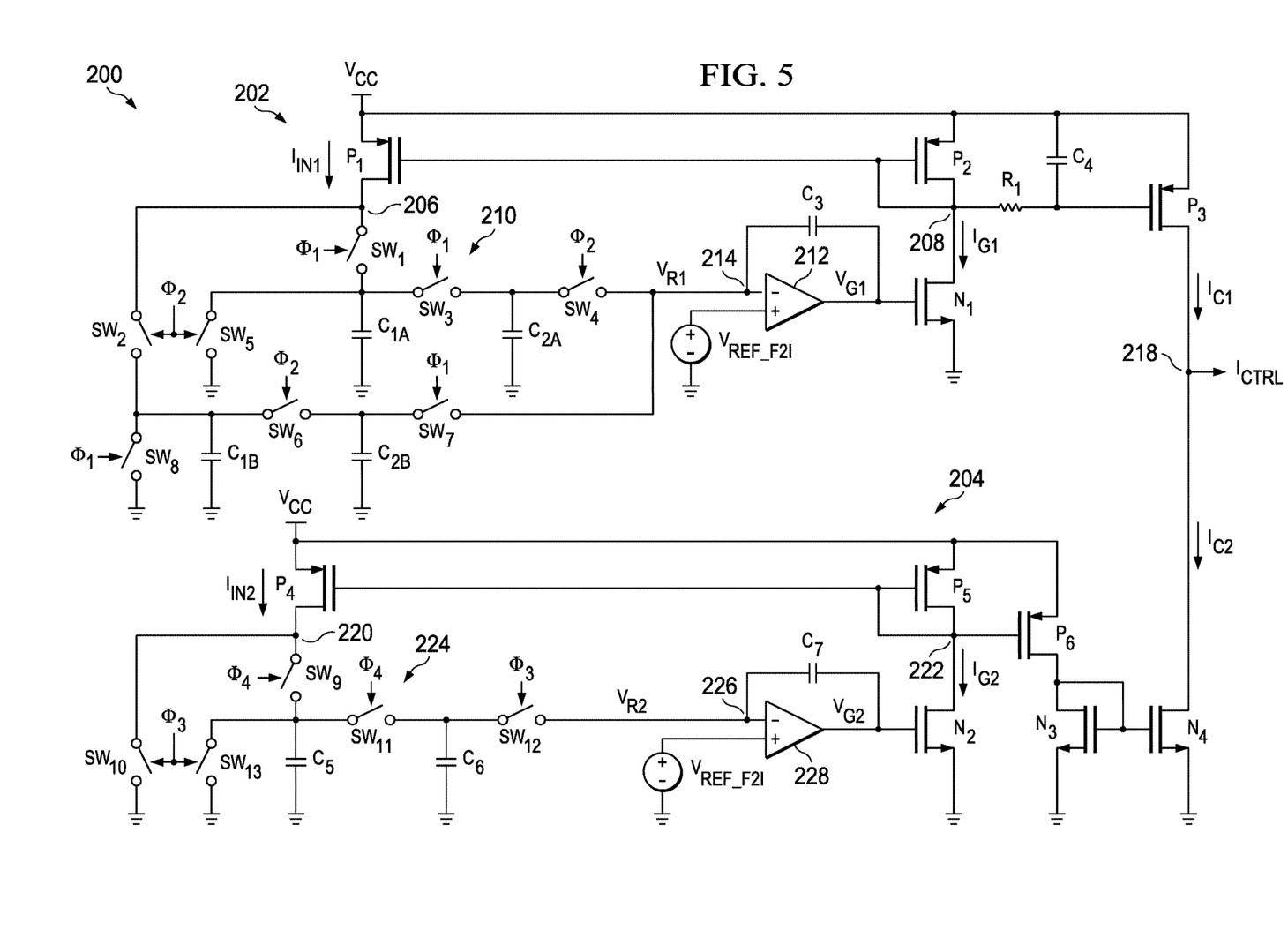
FIG. 5 illustrates an example of a first linear frequency-to-current converter and a second linear frequency-to-current converter.

FIG. 5 illustrates an example of a linear F2I converter system 200. The linear F2I converter system 200 can correspond to the first linear frequency-to-analog converter 16 and the second linear frequency-to-analog converter 18, as well as the subtractor 20, in the example of FIG. 1. Therefore, reference is to be made to the example of FIG. 1 in the following description of the example of FIG. 5. Additionally, while the example of FIG. 5 describes that the linear F2I converter system 200 is a linear F2I converter that generates a control current, it is to be understood that the linear frequency-to-analog converter could instead be configured as a linear frequency-to-voltage converter that generates a control voltage.

The linear F2I converter system 200 is configured to generate a control current $I_{CTRL}$ that has an amplitude that is based on the switching signals $\Phi_1$, $\Phi_2$, $\Phi_3$, and $\Phi_4$. In the example of FIG. 5, the linear F2I converter system 200 includes a first linear F2I converter 202 and a second linear F2I converter 204. The first linear F2I converter 202 is configured to generate a first control current portion $I_{C1}$ based on the switching signals $\Phi_1$ and $\Phi_2$. The first linear F2I converter 202 includes a first P-channel field effect transistor device (P-FET) $P_1$ that interconnects a node 206 and an input power voltage $V_{CC}$ and through which a current $I_{IN1}$ flows. For example, the P-FET $P_1$ is arranged in a current-mirror configuration with a P-FET $P_2$ that interconnects the input power voltage $V_{CC}$ and a control node 208.

The P-FETs $P_1$ and $P_2$ mirror the generated current back as the current $I_{IN1}$ in a feedback manner. The node 206 is coupled to a switched-capacitor resistor circuit 210 that is formed by switches $SW_1$ and $SW_5$ and a capacitor $C_{1A}$. The voltage on the capacitor $C_{1A}$ is then integrated by the switched-capacitor integrator circuit 210 formed by the switched-capacitor resistor, an amplifier 212, and a feedback capacitor $C_3$. Switches $SW_3$, $SW_4$ and a capacitor $C_{2A}$ form a switched-capacitor resistor used for the integrator. These switched-capacitor resistor circuits 210 and the amplifier 212 cooperate to behave as a switched-capacitor-resistor and a switched-capacitor integrator that are configured to set a voltage $V_{R1}$ at a node 214 to be approximately equal to a reference voltage $V_{REF\_F2I}$, as described in greater detail herein. In the example of FIG. 5, the switched-capacitor resistor circuit 210 includes a plurality of switches that can be arranged as any of a variety of different types of switches, such as transistors, thyristors, or other types of switches.

The switched-capacitor resistor circuit 210 includes the switch $SW_1$ that is controlled via the switching signal $\Phi_1$ and the switch $SW_2$ that is controlled via the switching signal $\Phi_2$. The switch $SW_3$ controlled by the switching signal $\Phi_1$ interconnects the first grounded capacitor $C_{1A}$ and the second grounded capacitor $C_{2A}$, and the switch $SW_4$ controlled by the switching signal $\Phi_2$ interconnects the second capacitor $C_{2A}$ and the node 214. A switch $SW_5$ that is controlled by the switching signal $\Phi_2$ provides a ground path for the capacitor $C_{1A}$. Additionally, a switch $SW_6$ controlled by the switching signal $\Phi_2$ interconnects a third grounded capacitor $C_{1B}$ and a fourth grounded capacitor $C_{2B}$, and a switch $SW_7$ controlled by the switching signal $\Phi_1$ interconnects the fourth capacitor $C_{2B}$ and the node 214. As an example, the capacitors $C_{1B}$ and $C_{2B}$ can have capacitance values that are approximately equal to the capacitors $C_{1A}$ and $C_{2A}$, respectively. A switch $SW_8$ controlled by the switching signal $\Phi_1$ is couple to the switch $SW_2$ and provides a ground path for the capacitor $C_{1B}$.

The node 214 is coupled to an inverting input of the amplifier 212 that also receives the reference voltage $V_{REF\_F2I}$ at its non-inverting input. In the example of FIG. 5, the amplifier 212 is configured in a feedback arrangement with respect to a capacitor $C_3$ connected between the amplifier output and its inverting input (node 214). The switches $SW_1$ and $SW_5$ together with the capacitor $C_{1A}$, and the switches $SW_2$ and $SW_8$ together with the capacitor $C_{1B}$ form switched-capacitor resistors. Moreover, the switches $SW_3$ and $SW_4$ together with the capacitor $C_{2A}$, and the switches $SW_6$ and $SW_7$ together with the capacitor $C_{2B}$ form a set of switched-capacitor resistors. When combined with the inverting amplifier 214 and the feedback capacitor $C_3$, the components form a switched-capacitor integrator circuit. The amplifier 212 is configured to set an amplitude of a first gate voltage $V_{G1}$ that is connected to drive a gate of a transistor device, demonstrated as an N-channel FET $N_1$. The N-FET $N_1$ interconnects the control node 208 at a gate/source of a diode-connected P-FET $P_2$, and thus the gate of the P-FET $P_1$, with ground. Therefore, the N-FET $N_1$ and the P-FET $P_2$ are configured as a current-generator. The control node 208 is coupled to an RC filter arrangement of a resistor $R_1$ and a capacitor $C_4$ that is coupled to a gate of a P-FET $P_3$ that is configured to generate the first F2I control current portion $I_{C1}$ that flows to an output node 218 from which the control current $I_{CTRL}$ is provided as an output from the linear F2I converter system 200. Therefore, the N-FET $N_1$ and the P-FET $P_2$ is configured to generate a current $I_{G1}$ that is mirrored to the P-FET $P_3$ and filtered via the RC filter to generate the first F2I control current portion $I_{C1}$.

The switched-capacitor resistor circuit 210 has a resistance value that is set by the switching frequency of the non-overlapping switching signals $\Phi_1$ and $\Phi_2$. The resistance of the switched-capacitor resistor circuit 210 has a lesser value at higher frequencies of the non-overlapping switching signals $\Phi_1$ and $\Phi_2$ and a greater value at lower frequencies of the non-overlapping switching signals $\Phi_1$ and $\Phi_2$. Therefore, the time constant of the switched-capacitor integrator becomes smaller, and the linear F2I converter circuit 202 reacts and settles faster at higher frequencies. Similarly, the time constant of the switched-capacitor-resistor integrator becomes larger, and the linear F2I converter circuit 202 reacts and settles slower at lower frequencies.

As an example, in steady state operation, when the switching signal $\Phi_2$ is activated, the capacitor $C_{1A}$ is discharged while the capacitor $C_{2A}$ is forced to the amplitude of the reference voltage $V_{REF\_F2I}$ based on the feedback loop of the amplifier 212 and feedback through the current mirror. Upon initiation of closure of the switches $SW_1$ and $SW_3$ via the switching signal $\Phi_1$, the charge on the capacitor $C_{2A}$ is shared between the capacitors $C_{1A}$ and $C_{2A}$, such that the voltages $V_{C1A}$ and $V_{C2A}$ of the respective capacitors $C_{1A}$ and $C_{2A}$ can be defined as:

$$V_{C1A}=V_{C2A}=(C_{2A}*V_{REF\_F2I})/(C_{1A}+C_{2A}) \quad \text{Equation 1}$$

During closure of the switches $SW_1$ and $SW_3$ via the switching signal $\Phi_1$, the current $I_{IN1}$ is integrated by the capacitors $C_{1A}$ and $C_{2A}$, causing the voltages $V_{C1A}$ and $V_{C2A}$ to increase linearly, such that the voltages $V_{C1A}$ and $V_{C2A}$ at the end of the closure of the switches $SW_1$, $SW_3$, and $SW_7$ via the first switching signal $\Phi_1$ can be defined as:

$$V_{C2}=(C_2*V_{REF\_F2I}+I_{IN1}*\Delta T_1)/(C_1+C_2) \quad \text{Equation 2}$$

Where: $\Delta T_1$ corresponds to an on-time of the switching signal $\Phi_1$, and thus an activation time the switches $SW_1$ and $SW_3$.

During the on-time of the activation of the switching signal $\Phi_2$, the extra charge of the capacitor $C_{2A}$ is discharged to the capacitor $C_3$ to thus provide the first voltage $V_{R1}$, and the capacitor $C_{1A}$ is discharged to ground via the switch $SW_5$. Because the duty-cycle of the input signal IN may be not be exactly 50%, the frequency of the input signal IN is divided by two to ensure that the switching signals $\Phi_1$ and $\Phi_2$ have an approximate 50% duty-cycle. Thus, based on the first voltage $V_{R1}$ being set approximately equal to the reference voltage $V_{REF\_F2I}$, the amplitude of the voltage $V_{G1}$ is set, and thus the current $I_{G1}$ is set. The current $I_{G1}$ thus affects the amplitude of the current $I_{IN1}$, which can be defined as:

$$I_{IN1}=F_{CLK}*C_{1A}*V_{REF\_F2I} \quad \text{Equation 3}$$

Where: $F_{CLK}$ corresponds to the frequency of the input signal IN and twice the switching frequency of the non-overlapping switching signals $\Phi_1$ and $\Phi_2$.

When mirrored from the P-FET $P_2$ to the P-FET $P_3$ by the current mirror, the currents $I_{G1}=I_{IN1}$ is multiplied (e.g., by four) by having the P-FET $P_3$ having a size that is twice the size of the P-FET $P_2$. Accordingly, based on the above-described operation of the switched-capacitor current source, the first control current portion $I_{C1}$ can be expressed as:

$$I_{C1}=4*I_{IN1}=4*(C_{1A}*V_{REF\_F2I})/$$
$$\Delta T_1=4*V_{REF\_F2I}*C_{1A}*F_{CLK} \quad \text{Equation 4}$$

The previous operation thus also works in substantially the same way in the opposite states of the switching signals $\Phi_1$ and $\Phi_2$ with respect to the switches $SW_6$, $SW_7$, and $SW_8$.

The second linear F2I converter 204 is configured to generate a second control current portion $I_{C2}$ based on the switching signals $\Phi_3$ and $\Phi_4$. In the example of FIG. 5, the second linear F2I converter 204 is configured substantially similar to the first linear F2I converter 202. For example, the second linear F2I converter 204 includes a P-FET $P_4$ that interconnects a node 220 and the input power voltage $V_{CC}$ and through which a current $I_{IN2}$ flows. The P-FET $P_4$ is arranged in a current-mirror configuration with a P-FET $P_5$ that interconnects the input power voltage $V_{CC}$ and a control node 222. The node 220 is coupled to a switched-capacitor resistor and integrator circuits 224 that are configured to set the amplitude of a second voltage $V_{G2}$.

The switched-capacitor resistor circuit 224 includes a switch $SW_9$ that is controlled via the switching signal $\Phi_4$ and a switch $SW_{10}$ that is controlled via the switching signal $\Phi_3$. A switch $SW_{11}$ controlled by the switching signal $\Phi_4$ interconnects a first grounded capacitor $C_5$ and a second grounded capacitor $C_6$, and a switch $SW_{12}$ controlled by the switching signal $\Phi_3$ interconnects the second capacitor $C_6$ and the node 226. A switch $SW_{13}$, which is controlled by the switching signal $\Phi_3$, provides a ground path for the capacitor $C_5$.

The node 226 is coupled to an inverting input of an amplifier 228 that also receives the reference voltage $V_{REF\_F2I}$ at a non-inverting input thereof. In the example of FIG. 5, the amplifier 228 is arranged in a feedback arrangement with respect to a capacitor $C_7$ connected between the output and inverting input at node 226. The switches $SW_9$ and $SW_{13}$ together with the capacitor $C_5$ form a switched-capacitor resistor. Moreover, the switches $SW_{11}$ and $SW_{12}$ together with the capacitor $C_6$ form another switched-capacitor resistor. When combined with the inverting amplifier 228 and the feedback capacitor $C_7$, the components form a switched-capacitor integrator circuit. The switched-capacitor integrator is configured to set the amplitude of a second gate voltage $V_{G2}$ that drives a gate of N-channel FET $N_2$. The N-FET $N_2$ interconnects the control node 222 that is a gate/source of the P-FET $P_5$, and thus the gate of the P-FET $P_4$, with ground. Therefore, the N-FET $N_2$ and the P-FET $P_5$ are configured as a current-generator. The control node 222 is coupled to a gate of a P-FET $P_6$ that is configured to generate the second control current portion $I_{C2}$ that flows from the output node 218 from which the control current $I_{CTRL}$ is provided as an output from the linear F2I converter system 200. Therefore, the control current $I_{CTRL}$ has amplitude that is equal to a difference (i.e., subtraction) of the first control current portion $I_{C1}$ and the second control current portion $I_{C2}$ with respect to the output node 218. Therefore, the N-FET $N_2$ and the P-FET $P_5$ is configured to generate a current $I_{G2}$ that is mirrored to an N-FET $N_3$ that is likewise arranged as a current-mirror with respect to an N-FET $N_4$ that conducts the second control current portion $I_{C2}$.

The switched-capacitor resistor circuit 224 in the second linear F2I converter 204 has a resistance value that is set by the frequency and duty-cycle of the switching signals $\Phi_3$ and $\Phi_4$, similar to as described previously with respect to the first linear F2I converter 202. For example, at steady state operation, when the switching signal $\Phi_3$ is activated, the capacitor $C_5$ is discharged while the capacitor $C_6$ is forced to the amplitude of the reference voltage $V_{REF\_F2I}$ based on the feedback loop of the circuit. Upon initiation of closure of the switches $SW_9$ and $SW_{11}$ via the switching signal $\Phi_4$, the extra charge on the capacitor $C_6$ is shared between the capacitors $C_5$ and $C_6$, such that the voltages $V_{C5}$ and $V_{C6}$ of the respective capacitors $C_5$ and $C_6$ can be defined as:

$$V_{C5}=V_{C6}=(C_6*V_{REF\_F2I})/(C_5+C_6) \quad \text{Equation 5}$$

During closure of the switches $SW_9$ and $SW_{11}$ via the switching signal $\Phi_4$, the current $I_{IN2}$ is integrated with respect to the capacitors $C_5$ and $C_6$, causing the voltages $V_{C5}$ and $V_{C6}$ to increase linearly, such that the voltages $V_{C5}$ and $V_{C6}$ at the end of the closure of the switches $SW_9$ and $SW_{11}$ via the first switching signal $\Phi_4$ can be defined as:

$$V_{C6} = (C_6 * V_{REF\_F2I} + I_{IN2} * \Delta T_4)/(C_5 + C_6) \quad \text{Equation 6}$$

Where: $\Delta T_4$ corresponds to an on-time of the switching signal $\Phi_4$, and thus an activation time the switches $SW_9$ and $SW_{11}$.

During the on-time of the activation of the switching signal $\Phi_3$, the charge of the capacitor $C_6$ is discharged to the capacitor $C_7$ to thus provide the second voltage $V_{G2}$, and the capacitor $C_5$ is discharged to ground via the switch $SW_{13}$. As a result, similar to as expressed previously, the amplitude of the second control current portion $I_{C2}$ can be expressed as follows:

$$I_{C2} = (C_5 * V_{REF\_F2I})/\Delta T_4 = C_5 * V_{REF\_F2I} * F_{CLK}/D \quad \text{Equation 7}$$

Where: D is the duty cycle of the signal $\Phi_4$.

As an example, based on the configuration (e.g., relative gate size) of the transistor devices of the linear F2I converter system 200, the first F2I control current portion $I_{C1}$ can have an amplitude that is approximately twice the amplitude of the second F2I control current portion $I_{C2}$ during a steady-state, in which the PLL output signal $OUT_{PLL}$ is substantially phase-aligned with the input signal IN and the non-overlapping switching signals $\Phi_3$ and $\Phi_4$ have an approximately 50% duty-cycle. Therefore, in the steady-state, the control current $I_{CTRL}$ has an amplitude that is approximately equal to the second F2I control current portion $I_{C2}$, and thus half the amplitude of the first F2I control current portion $I_{C1}$. However, when the PLL output signal $OUT_{PLL}$ is out-of-phase with respect to the input signal IN, the non-overlapping switching signals $\Phi_3$ and $\Phi_4$ have duty-cycle that is not 50%. The variation in the duty-cycle of the non-overlapping switching signals $\Phi_3$ and $\Phi_4$ can thus result in a change in amplitude of the second F2I control current portion $I_{C2}$ that is less than or greater than its amplitude at the steady-state, thus resulting in a change in amplitude of the control current $I_{CTRL}$ as likewise being less than or greater than the amplitude at the steady-state. Accordingly, the control current $I_{CTRL}$ can vary based on the phase-difference between the input signal IN and the PLL output signal $OUT_{PLL}$, such that the linear oscillator 22 in the example of FIG. 1 can vary the phase of the PLL output signal $OUT_{PLL}$, as described herein.

Figure 6:
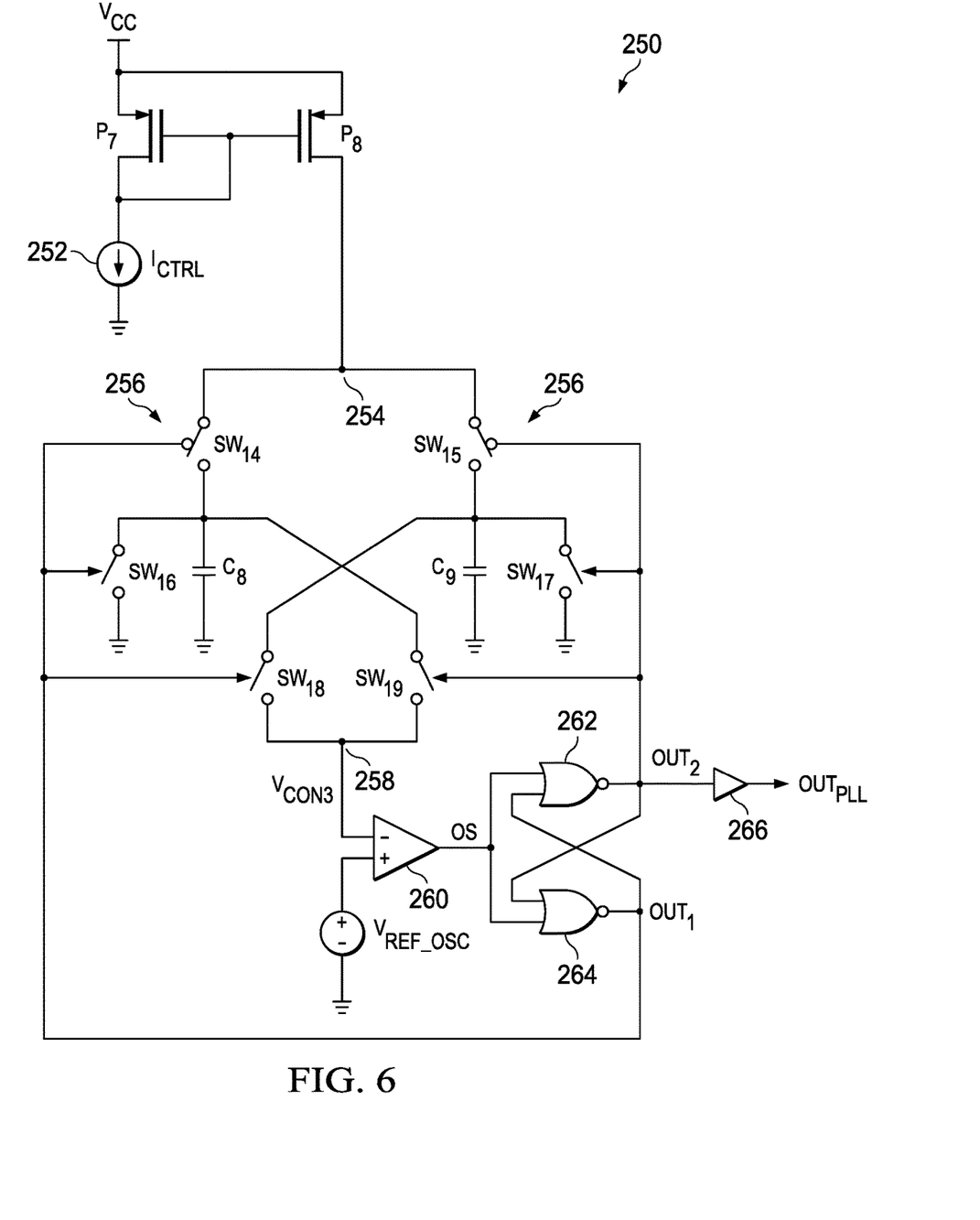
FIG. 6 illustrates an example of a linear current-controlled oscillator.

FIG. 6 illustrates an example of a linear current-controlled oscillator 250. The linear current-controlled oscillator 250 can correspond to the linear oscillator 22 in the example of FIG. 1. Therefore, reference is to be made to the example of FIG. 1 in the following description of the example of FIG. 6. Additionally, while the example of FIG. 6 describes that the linear oscillator is a linear current-controlled oscillator, it is to be understood that the linear oscillator could instead be configured as a voltage-controlled linear oscillator that generates the PLL output signal $OUT_{PLL}$ in a linear manner.

The linear current-controlled oscillator 250 is configured to generate the PLL output signal $OUT_{PLL}$ based on the amplitude of the control current $I_{CTRL}$, such as in a linear manner. In the example of FIG. 6, the linear current-controlled oscillator 250 includes a first P-FET $P_7$ that interconnects the current input power voltage $V_{CC}$ and a current source 252 corresponding to the control current $I_{CTRL}$. The P-FET $P_7$ is arranged in a current-mirror configuration with a P-FET $P_8$ that interconnects the input power voltage $V_{CC}$ and a node 254. The node 254 is coupled to a set of switches and capacitors configured as an oscillator circuit 256 that is configured to integrate the control current $I_{CTRL}$.

The oscillator circuit 256 includes a switch $SW_{14}$ that is controlled via a switching signal $OUT_1$ and interconnects the node 254 and a grounded capacitor $C_8$, and a switch $SW_{15}$ that is controlled via the inverted switching signal $OUT_2$ and interconnects the node 254 and a grounded capacitor $C_9$. As an example, the capacitors $C_8$ and $C_9$ can be approximately equal in capacitance. A switch $SW_{16}$ controlled by the switching signal $OUT_1$ provides a ground path for the capacitor $C_8$, and a switch $SW_{17}$ controlled by the switching signal $OUT_2$ provides a ground path for the capacitor $C_9$. Additionally, a switch $SW_{18}$ controlled by the switching signal $OUT_1$ interconnects the capacitor $C_9$ and the control node 258 and a switch $SW_{19}$ controlled by the switching signal $OUT_2$ interconnects the capacitor $C_8$ and the control node 258.

The control node 258 is coupled to an inverting input of a comparator 260 that also receives a reference voltage $V_{REF\_OSC}$ at a non-inverting input. In the example of FIG. 6, the comparator 260 is configured to generate an oscillating signal OS that is provided to a logic arrangement of a first NOR gate 262 and a second NOR gate 264, with the second NOR gate 264 having an output that generates the first switching signal $OUT_1$ and the first NOR gate 262 having an output that generates the second switching signal $OUT_2$. The second switching signal $OUT_2$ is provided to an output buffer 266 that is configured to generate the PLL output signal $OUT_{PLL}$. Therefore, based on the amplitude of the control current $I_{CTRL}$, the capacitor size, and the reference voltage $V_{REF\_OSC}$, a frequency of the oscillating signal OS can be set. Accordingly, the PLL output signal $OUT_{PLL}$ is generated in a linear manner, and can be phase-aligned with the input signal IN, as described herein.

For example, the frequency $F_{OSC}$ of the PLL output signal $OUT_{PLL}$ can be expressed as follows:

$$F_{OSC} = I_{CTRL}/(2 * C_8 * V_{REF\_OSC}) \quad \text{Equation 6}$$

As an example, the reference voltage $V_{REF\_OSC}$ can be approximately equal to the reference voltage $V_{REF\_F2I}$, such that, for operation of the linear current-controlled oscillator in a linear manner, the frequency $F_{OSC}$ can be expressed as follows:

$$F_{OSC} = (2 * C_1 * V_{REF\_F2I})/(2 * C_8 * V_{REF\_OSC}) = C_1 * F_{CLK}/C_8 \quad \text{Equation 7}$$

When the capacitors $C_1$ and $C_8$ are chosen to be equal to each other, the oscillating signal OS frequency becomes equal to the input signal IN frequency. The size of the F2I converters can be smaller than a charge pump and a large filter is required to implement other analog PLLs. The size of the F2I converters is mainly determined by the size of the capacitors. The F2I converters total area can be optimized meeting its stability condition for proper circuit operation as follows:

$$\frac{g_m(M_1) \cdot C_2}{4 \cdot F_{CLK} \cdot C_3 \cdot (C_2 + C_1)} < 1 \quad \text{Equation 8}$$

Where: $g_m(N_1)$ is the transconductance of $N_1$.

Equation 8 also determines the minimum required size of the capacitors to make the circuit stable. The capacitance $C_1$ is chosen based on Equation 7 by equating it to the oscillator capacitance to have input and output frequencies match. By using a small capacitor value for capacitance $C_2$, the capacitance $C_3$ can be calculated based on Equation 8 at the lowest switching frequency.

While the linear current-controlled oscillator 250 is demonstrated as including the oscillator circuit 256, the comparator 260, and the output logic formed from the NOR gates 262 and 264, it is to be understood that the linear current-controlled oscillator 250 can be arranged in any of a variety of different ways to provide the PLL output signal $OUT_{PLL}$ in a linear manner based on the amplitude of the control current $I_{CTRL}$. Accordingly, the linear current-controlled oscillator 250 is not limited to the arrangement demonstrated in the example of FIG. 6.

As described in herein, the PLL circuits 10 and 50 provide a more die area efficient and more effective alternative to typical analog or digital PLL designs based on the compact design of the linear F2I circuits as well as the simplified design achieved by linearizing the circuit blocks of the PLL. By implementing the linear frequency-to-analog converters 16 and 18 (e.g., the linear F2I converters 202 and 204), the PLL circuits 10 and 50 achieves a less complex and smaller design than a charge pump and large low-pass filter that is used by other analog PLL circuits. The F2I converters can be implemented by using small capacitors resulting in a very compact design, and can be implemented in a more compact die area relative to typical charge-pump based analog PLL designs. Additionally, the combination of the linear frequency-to-analog converters 16 and 18 and the linear oscillator 22 (e.g., the linear current-controlled oscillator 250) in converting the frequency and phase information associated with the input signal IN and the PLL output signal $OUT_{PLL}$ from the digital domain to the analog domain, then back to the digital domain in a linear manner provides for ease of loop compensation compared to the compensation of typical PLL designs. Thus, the compact design and fast-settling capability of the PLL circuits 10 and 50 can provide suitable integration with switching regulators or phase-error correction in communication systems.

Figure 7:
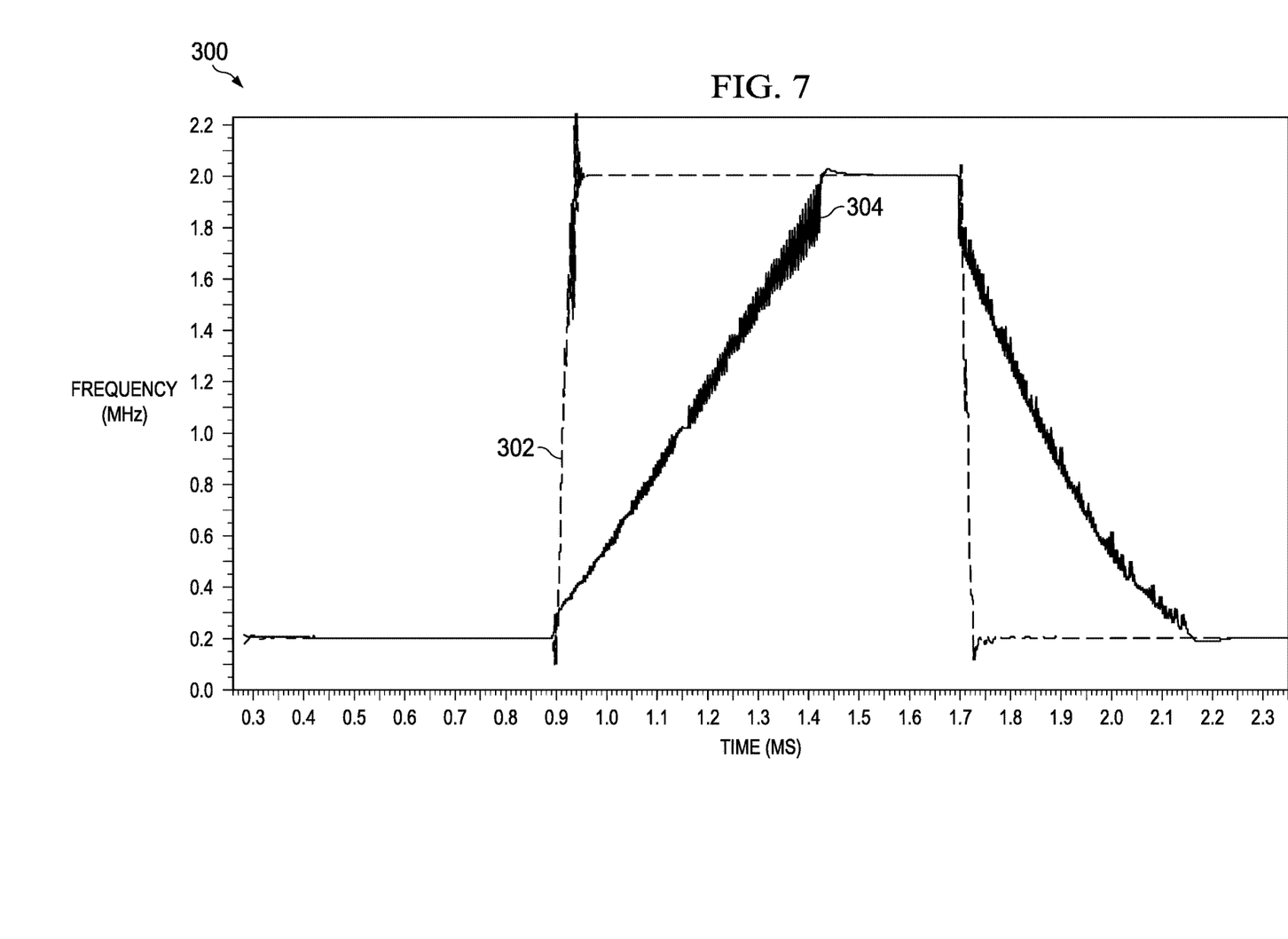
FIG. 7 illustrates an example of a timing diagram.

Furthermore, the linear frequency-to-analog converters 16 and 18 also provide for a more rapid settling time than other analog or digital PLL designs, as demonstrated in the example of FIG. 7. FIG. 7 illustrates an example of a timing diagram 300. The timing diagram 300 demonstrates frequency, in MHz, plotted as a function of time (in milliseconds). The timing diagram 300 demonstrates a step-response 302 of a PLL circuit as described herein, such as the PLL circuit 10 or the PLL circuit 50 in the respective examples of FIGS. 1 and 2, such as implementing the F2I converters 202 and 204 in the example of FIG. 5. The timing diagram 300 also demonstrates a step-response 304 of a typical PLL circuit that implements a charge-pump, as opposed to the frequency-to-analog converters described herein. Thus, the timing diagram 300 demonstrates a much more rapid frequency-response of the PLL circuits 10 and 50, as described herein based on utilizing a scaled bandwidth and response time with frequency of operation, than typical PLL circuits that implement a charge-pump based design.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A phase-locked loop (PLL) circuit comprising:
a frequency divider having a frequency divider input and having a first frequency divider output and a second frequency divider output, the first and second frequency divider outputs providing a first set of non-overlapping switching signals having a frequency proportional to the frequency of the signal at the frequency divider input;
a phase detector having a phase detector input connected to the frequency divider input and a feedback input, and having a first and phase detector output and a second phase detector output, the first and second phase detector outputs providing a second set of non-overlapping switching signals having a frequency proportional to the frequency of the signal at the phase detector input, and a duty cycle proportional to the phase difference between the signal at the phase detector input and the signal at the feedback input;
a first linear frequency-to-analog converter having a first converter output, a first converter input and a second converter input, the first and second converter inputs coupled to the first frequency divider output and the second frequency divider output, respectively, the first converter output providing a first control signal having an amplitude that is determined by the first set of non-overlapping switching signals;
a second linear frequency-to-analog converter having a second converter output, a third converter input and a fourth converter input, the third and fourth converter inputs coupled to the first phase detector output and the second phase detector output, respectively, the second converter output providing a second control signal having an amplitude that is determined by the second set of non-overlapping switching signals;
a subtractor having a first input coupled to the first control signal, a second input coupled to the second control signal, and a subtractor output; and
a linear oscillator having an input coupled to the subtractor output, and a PLL output responsive to the amplitude of the subtractor output and providing a signal having a frequency and phase that approximate the signal, and the PLL output is coupled to the feedback input.

2. The circuit of claim 1, wherein the second linear frequency-to-analog converter is configured to provide the second control signal as a current having an amplitude proportional to a phase difference between the phase detector input and the PLL output.

3. The circuit of claim 1, wherein the linear oscillator is configured as a linear current-controlled oscillator including:
output logic configured to provide the PLL output responsive to an oscillating signal;
an oscillator circuit controlled via the output logic to set an amplitude at a capacitor voltage output responsive to a current corresponding to the control signal;
a comparator having a first comparator input coupled to the capacitor voltage output, a second comparator input coupled to an oscillator reference voltage terminal, and a comparator output providing the oscillating signal.

4. The circuit of claim 1, fabricated in an integrated circuit (IC) chip.

5. The circuit of claim 1, wherein the first linear frequency-to-analog converter is configured to provide the first control signal as a current having a duty cycle that approximates 50%.

6. The circuit of claim 1, wherein the first input, the second input, and the subtractor output are each currents.

7. The circuit of claim 1, wherein the phase detector non-overlapping switching signals are complementary relative to each other.

8. The circuit of claim 1, wherein the frequency divider non-overlapping switching signals have approximately the same amplitude.

9. The circuit of claim 1, wherein the frequency and phase of the linear oscillator output approximates the frequency and phase of the phase detector input signal.

10. A phase-locked loop (PLL) circuit comprising:
a frequency divider having a frequency divider input, and having a frequency divider output providing a first set of non-overlapping switching signals responsive to the frequency divider input;
a phase detector having a phase detector input connected to the frequency divider input, having a feedback input, and having a phase detector output providing a second set of non-overlapping switching signals, the switching signals being responsive to the time between a rising edge of the phase detector input signal and a falling edge of the feedback input signal;
a linear frequency-to-analog converter having converter inputs coupled to the frequency divider output and the phase detector output, and having a converter output providing a control signal having an amplitude responsive to the first and second sets of non-overlapping switching signals; and
a linear oscillator having an oscillator input and a PLL output, the oscillator input coupled to the converter output, and the PLL output having a frequency and phase that approximate the input signal responsive to the amplitude of the control signal, the PLL output being coupled to the feedback input.

11. The circuit of claim 10, wherein the linear frequency-to-analog converter is configured as a linear frequency-to-current converter providing the control signal as a current responsive to the frequency of the converter input, and to adjust the amplitude of the control signal current responsive to a phase difference between the phase detector input and the PLL output.

12. The circuit of claim 10, wherein the frequency divider provides the first set of non-overlapping switching signals having a frequency proportional to the frequency of the input signal, and the phase detector provides the second set of non-overlapping switching signals responsive to a phase-difference between the phase detector input and the PLL output.

13. The circuit of claim 10, wherein the linear oscillator is configured as a linear current-controlled oscillator including:
output logic configured to provide the PLL output based on an oscillating signal;
an oscillator circuit that is controlled via the output logic to set an amplitude of a capacitor voltage responsive to a current corresponding to the control signal; and
a comparator providing, at its output, an oscillating signal responsive to the capacitor voltage and an oscillator reference voltage at its inputs.

14. An integrated circuit (IC) chip including the PLL circuit of claim 10.

* * * * *